United States Patent
Phan et al.

(10) Patent No.: US 7,414,296 B2
(45) Date of Patent: Aug. 19, 2008

(54) METHOD OF MANUFACTURING A METAL-INSULATOR-METAL CAPACITOR

(75) Inventors: Tony Thanh Phan, Flower Mound, TX (US); Farris D. Malone, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 185 days.

(21) Appl. No.: 11/352,847

(22) Filed: Feb. 13, 2006

(65) Prior Publication Data

US 2006/0128109 A1  Jun. 15, 2006

Related U.S. Application Data

(62) Division of application No. 10/894,589, filed on Jul. 20, 2004, now Pat. No. 7,029,972.

(51) Int. Cl.
*H01L 21/8242* (2006.01)
*H01L 31/113* (2006.01)
(52) U.S. Cl. ............... 257/532; 257/534; 257/E21.011; 257/E21.016; 257/E21.021
(58) Field of Classification Search .................. 257/532, 257/534; 438/957
See application file for complete search history.

(56) References Cited

U.S. PATENT DOCUMENTS

| | | | |
|---|---|---|---|
| 5,122,923 A * | 6/1992 | Matsubara et al. | 361/321.5 |
| 5,262,343 A * | 11/1993 | Rhodes et al. | 438/3 |
| 5,618,749 A | 4/1997 | Takahashi et al. | |
| 5,990,507 A | 11/1999 | Mochizuki et al. | |
| 2003/0040161 A1* | 2/2003 | Schrenk et al. | 438/393 |
| 2005/0170598 A1* | 8/2005 | Howard et al. | 438/396 |

OTHER PUBLICATIONS

Chu, K., et al., "Material and electrical characterization of carbon-doped $Ta_2O_5$ films for embedded dynamic random access memory applications," *Journal of Applied Physics*, vol. 91, No. 1, Jan. 2002, pp. 308-316.

* cited by examiner

*Primary Examiner*—Long K Tran
(74) *Attorney, Agent, or Firm*—W. James Brady, III; Frederick J. Telecky, Jr.

(57) ABSTRACT

The present invention provides method of manufacturing a metal-insulator-metal capacitor (100). A method of manufacturing includes depositing a first refractory metal layer (105) over a semiconductor substrate (110). The first refractory metal layer (105) over a capacitor region (200) of the semiconductor substrate (110) is removed and a second refractory metal (300) is deposited over the capacitor region (200). Other aspects of the present invention include a metal-insulator-metal capacitor (900) and a method of manufacturing an integrated circuit (1000).

9 Claims, 7 Drawing Sheets

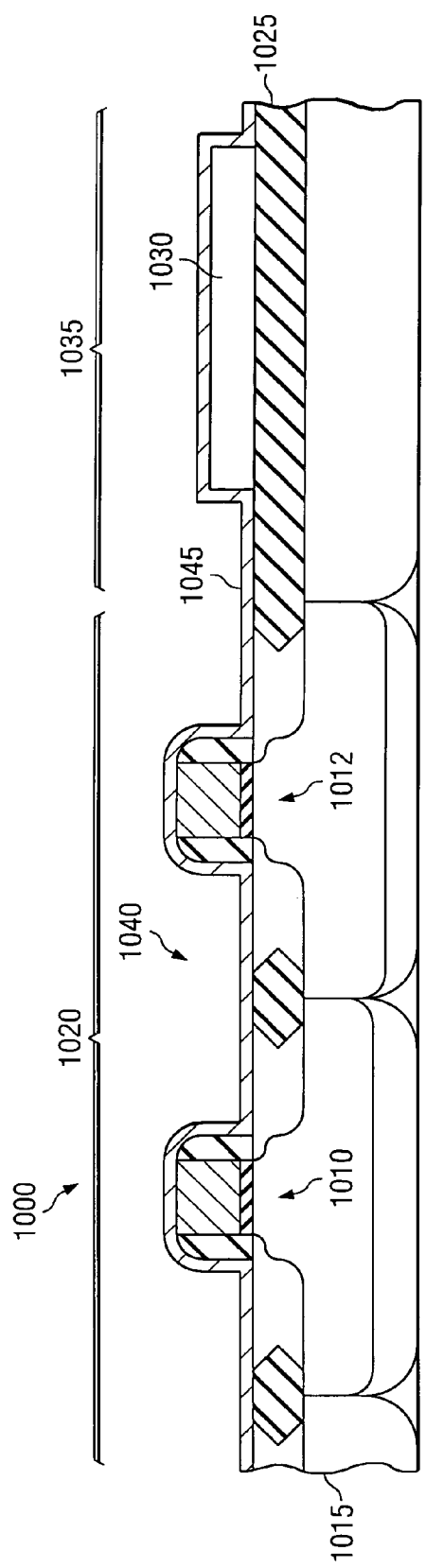
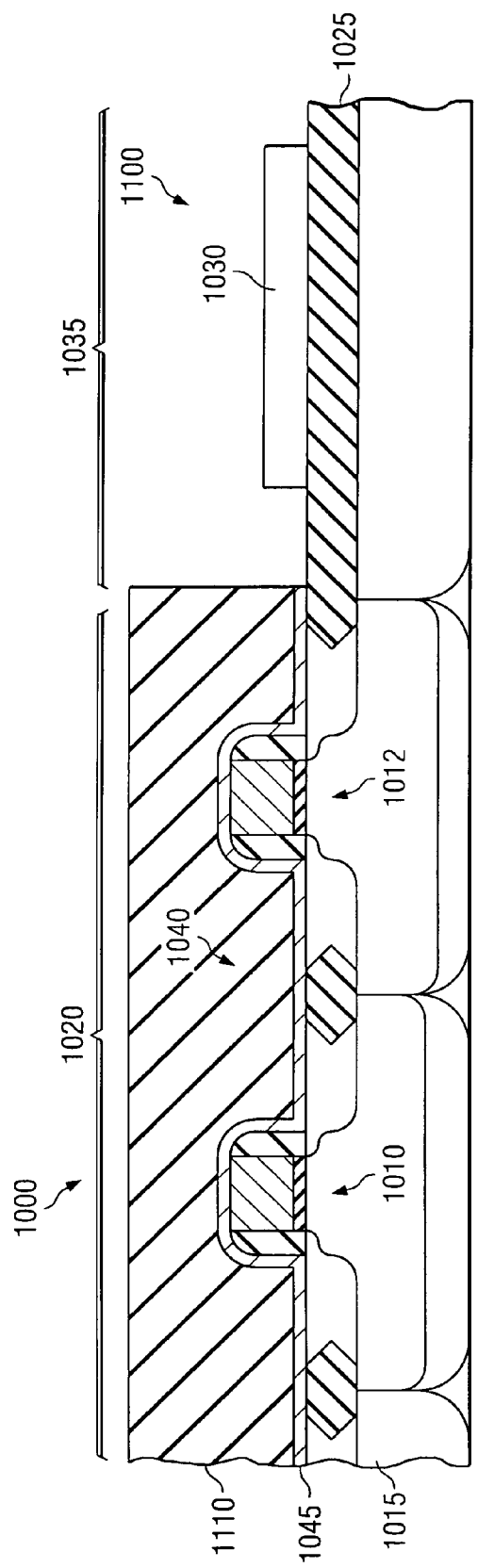

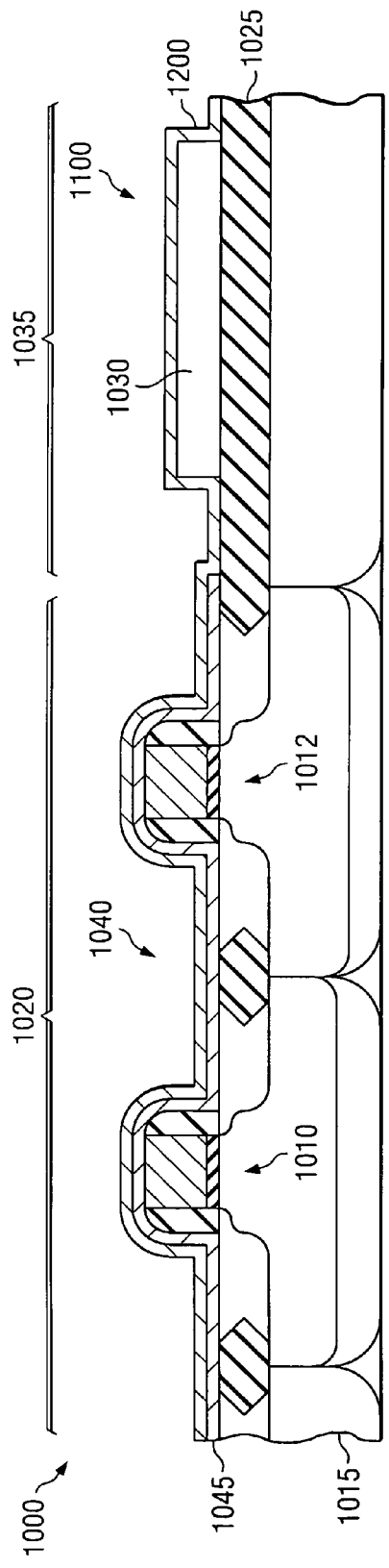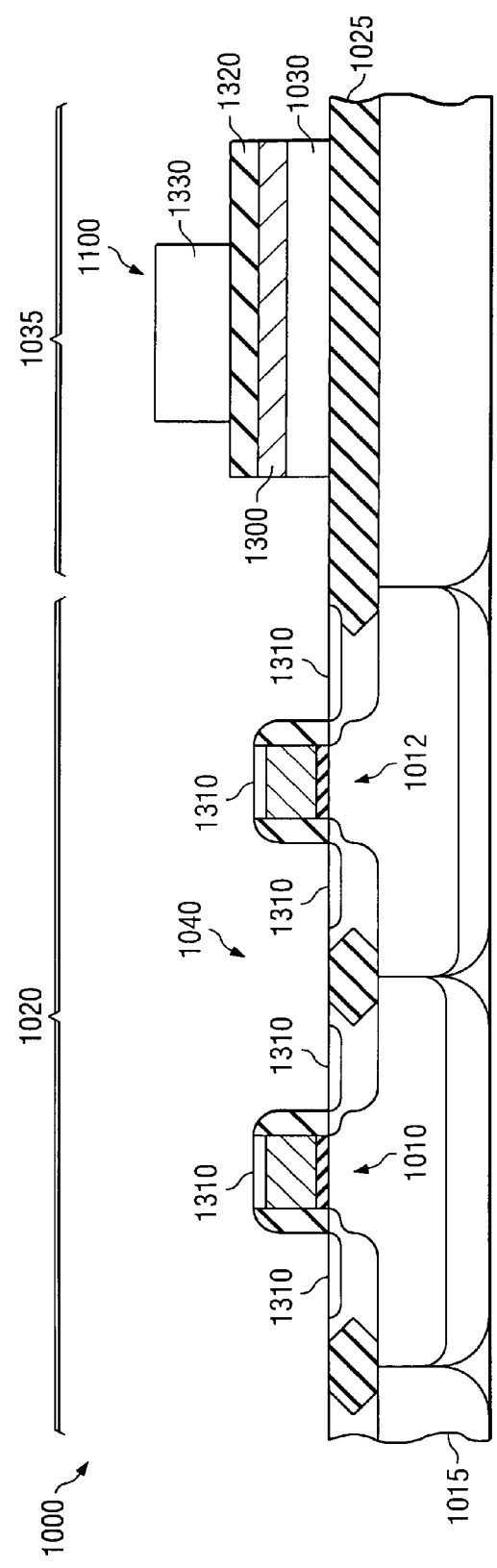

METHOD OF MANUFACTURING A METAL-INSULATOR-METAL CAPACITOR

This application is a divisional of application Ser. No. 10/894,589, filed Jul. 20, 2004, now U.S. Pat. No. 7,029,972.

TECHNICAL FIELD OF THE INVENTION

The present invention is directed, in general, to a method for manufacturing a semiconductor device, and, more specifically, to a method for manufacturing a metal-insulator-metal capacitor.

BACKGROUND OF THE INVENTION

Analog and memory integrated circuits have gained wide acceptance and utility in present day technologies, and the use of capacitors in these integrated circuits is almost universal. A typical integrated circuit will often include a metal-insulator-metal (MIM) capacitor, also interchangeably referred to as a metal-oxide-metal (MOM) capacitor. MIM capacitors are desirable because they have capacitor plates that are not subject to depletion. Consequently these capacitors have a low voltage coefficient. Additionally, MIM capacitors advantageously have a low temperature coefficient and excellent linearity.

MIM capacitors have also gained wide acceptance because they can be easily integrated into existing semiconductor device fabrication schemes. In many process flows, MIM capacitors are manufactured on the same level and in conjunction with the manufacture of active devices. That is, the component parts of the MIM capacitor and active device are manufactured in the same processing step. As an example, source, drain and gate electrodes in nMOS and pMOS transistors, and the first plate of the MOM capacitor, are often made from the same metal layer, provided in a blanket deposition step. Although the manufacture of active devices and MIM capacitor components in an integrated fashion is desirable, the performance characteristics of the MIM capacitor can suffer. In particular, it has been found that the leakage current of the MIM capacitor is unacceptably high, thereby limiting its use in many device applications or reducing yields of devices having acceptable operating characteristics.

Accordingly, what is needed in the art is a MIM capacitor and method of manufacture thereof that does not suffer from the disadvantages associated with conventionally manufactured MIM capacitors, as discussed above.

SUMMARY OF THE INVENTION

To address the above-discussed deficiencies of the prior art, the present invention provides in one embodiment, a method of manufacturing a metal-insulator-metal (MIM) capacitor. The method includes depositing a first refractory metal layer over a semiconductor substrate and removing the first refractory metal layer over a capacitor region of the semiconductor substrate. The method further includes depositing a second refractory metal layer over the capacitor region.

In another embodiment, the present invention provides a MIM capacitor. The MIM capacitor includes a first conductive plate located over a semiconductor substrate. The first conductive plate comprises a silicided refractory metal layer. The MIM capacitor also includes a dielectric layer on the first conductive plate. An interface between the first conductive plate and the dielectric layer has a roughness of between about ±5 nanometers and about ±15 nanometers.

Another aspect of the present invention is a method of manufacturing an integrated circuit. This embodiment includes forming transistors over a semiconductor substrate in a transistor region and forming at least one MIM capacitor over the semiconductor substrate in a capacitor region. Interconnections are formed on insulating layers located over the transistor and the MIM capacitor to thereby interconnect the MIM capacitor and the transistors to form an active device. Forming the MIM capacitor includes forming a first refractory metal layer over the transistor and the capacitor region and removing the first refractory metal in the capacitor region. A second refractory metal layer is deposited over the capacitor region. The second refractory metal layer is reacted with a silicon layer in the capacitor region to form a silicided refractory metal layer.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the scope of the invention.

BRIEF DESCRIPTION OF THE DRAWINGS

For a more complete understanding of the present invention, reference is now made to the following detailed description taken in conjunction with the accompanying FIGUREs. It is emphasized that various features may not be drawn to scale. In fact, the dimensions of various features may be arbitrarily increased or reduced for clarity of discussion. In addition, it is emphasized that some circuit components may not be illustrated for clarity of discussion. Reference is now made to the following descriptions taken in conjunction with the accompanying drawings, in which:

FIGS. 10-14 illustrate cross-sectional views of selected steps in an exemplary method of manufacturing an integrated circuit following the principles of the present invention.

DETAILED DESCRIPTION

The present invention recognizes for the first time that current leakage is strongly influenced by the thickness of a portion of a first conductive plate of the MIM capacitor. In particular, it has been found that increasing the thickness of a silicided refractory metal layer in the first conductive plate causes an increase in the roughness at the interface between the first conductive plate and the dielectric layer.

While not limiting the scope of the invention by theory, it is presently believed that there are an increased number of positive charge traps at a rough interface as compared to a smooth interface. An increased number of positive charge traps at the interface, as well as the variable thickness of the conductive plate, are both thought to increase the probability that an electron will leak through the capacitor.

In an effort to reduce the leakage current of the MOM capacitor, a thin layer of a blanket-deposited refractory metal was applied and then reacted to form a thinner silicided refractory metal layer. The refractory metal layer was used to form both the electrodes in active device structure, and the first conductive plate of the capacitor. Although the MIM capacitor has a reduced leakage current, the presence of a thinner silicided refractory metal layer in the active device structures unacceptably increased the series resistance in the active devices. A higher series resistance, in turn, reduces the speed at which the active devices can operating at.

The present invention presents a unique method of manufacturing a low-leakage MIM capacitor while maintaining a low series resistance in active devices. A relatively thick blanket-deposited first refractory metal layer is deposited and retained in the active device regions but removed in the capacitor regions. A second refractory metal layer that is thinner than the first refractory metal layer is deposited only in the capacitor region. By depositing a thin second refractory metal layer, the roughness at the interface can be reduced to a level conducive to minimizing the leakage current of the capacitor.

It should be noted that although presented in the context of manufacturing a MIM capacitors the present invention has additional applications. An example the application to CMOS and bipolar processes where the speed performance and leakage are the constraints. For instance, for digital UPP cell phones, speed is critical to bandwidth and low leakage is required to achieve long battery lifetime. Leakage from the SRAM circuits contributes to the static power consumption. Incorporating the principles of the present invention into an SRAM circuit would reduce the leakage.

Figure 1:
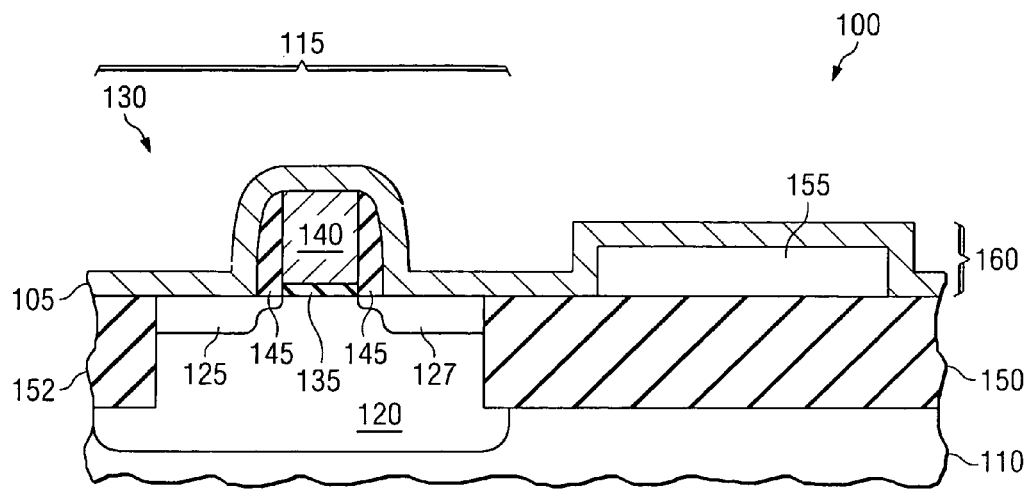
FIGS. 1 to 8 illustrate cross-sectional views of selected steps in an exemplary method of manufacturing a metal-insulator-metal (MIM) capacitor according to the principles of the present invention.

One embodiment of the present invention is a method of manufacturing a MIM capacitor. FIGS. 1 to 8 illustrate cross-sectional views of selected steps in an exemplary method of manufacturing a MIM capacitor 100. Turning first to FIG. 1, illustrated is the partially constructed capacitor 100 after depositing a first refractory metal layer 105 over a semiconductor substrate 110. For the purposes of the present invention, a refractory metal is defined as any element in Groups 4-6 and Periods 4-6 of the Periodic Table of Elements, as well as elements in the Lanthanide and Actinide series (International Union of Pure and Applied Chemist Convention for designating Groups and Periods). The first refractory metal layer 105 can be deposited using any physical vapor deposition (PVD) process, such as sputtering, as well as chemical vapor deposition (CVD) or other processes well known to those skilled in the art.

As further illustrated in FIG. 1, the first refractory metal layer 105 is preferably a blanket-deposited layer and therefore is also over one or more conventionally formed transistor 115 located on the semiconductor substrate 110. The transistor 115 can include a conductive well 120, in which are formed source/drain structures 125, 127. A transistor gate 130 having a gate dielectric layer 135, gate 140 and spacers 145 is located over the conductive well 120 and the source/drain structures 125, 127. As further discussed below, the first refractory metal layer 105 is advantageously used to form electrodes to facilitate the interconnection between the transistor 115 and other device components. It is advantageous for the first refractory metal layer 105 to be thick enough to facilitate a low series resistance in the transistor 115. As an example, when the first refractory metal layer 105 is made of titanium, a thickness of at least about 60 nanometers is preferred. However other thickness are also withing the scope of the present invention. Of course, different refractory metal can require a different thickness to minimize the series resistance of the transistor 115. One of ordinary skill in the art would understand how to adjust the thickness of the first refractory metal layer 105 accordingly.

In some advantageous embodiments, the semiconductor substrate 110 is made of silicon, although other conventional substrate materials, such as silicon-on-insulator, gallium arsenide, germanium, and silicon-germanium substrates, are also within the scope of the invention. For example, the semiconductor substrate 110 can be a layer located below the partially completed MIM capacitor 100, and include a silicon wafer itself or a layer located above the wafer as an epitaxial layer, such as a silicon layer of a silicon-on-insulator (SOI) substrate, or other substrate. The semiconductor substrate 110 can be suitably doped to be a p-type or n-type semiconductor substrate.

As further illustrated in FIG. 1, the semiconductor substrate 110 preferably includes an insulating layer 150. In some embodiments the insulating layer comprises silicon dioxide deposited by thermal growth or other conventional techniques. The insulating layer 150 serve to provide electrical isolation of the capacitor 100 form other components on the substrate 110. As illustrated in FIG. 1 a similarly composed insulating layer 152 can also serve as an field oxide structure or shallow trench isolation structure to isolated the transistor 115 and the capacitor 100 from each other or other components.

Preferably, a silicon layer 155, such a polysilicon, is formed on the insulating layer 150 using conventional deposition and patterning techniques. The silicon layer 155 provides a source of silicon atoms to form a silicided refractory metal layer as discussed below. The silicon layer 155 can also comprise a portion a first conductive plate 160 of the capacitor 100. As illustrated in FIG. 1 in some preferred embodiments, portions of a blanket deposited polysilicon layer are patterned to form both the silicon layer 155 for the first conductive plate 160 and the gate 140 for the transistor 115.

Figure 2:
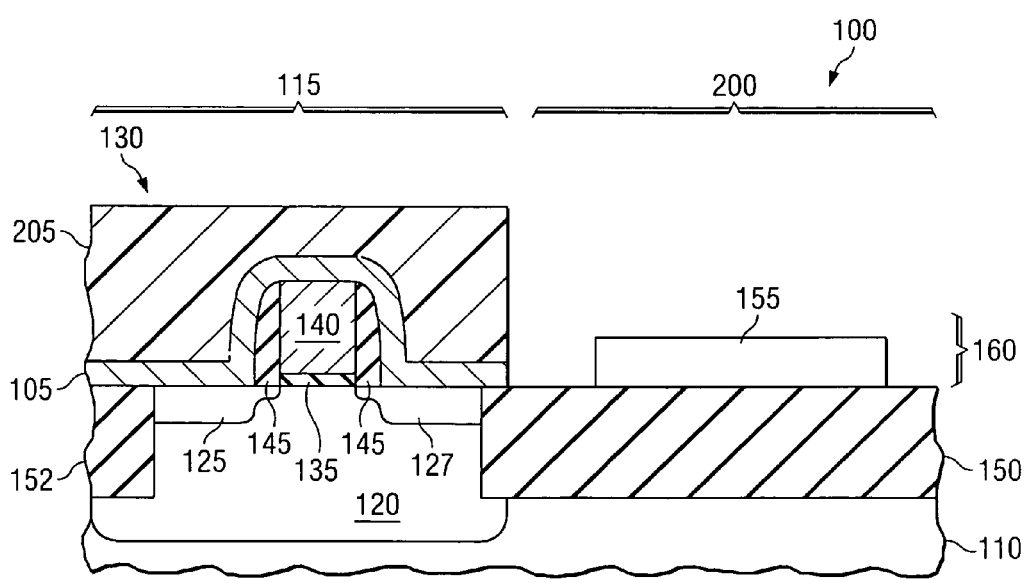

With continuing reference to FIG. 1, FIG. 2 shows the partially completed MIM capacitor 100 after removing the first refractory metal layer 105 over a capacitor region 200 of the semiconductor substrate 110. In some embodiments, removing the first refractory metal layer 105 includes forming a mask 205 over all of the semiconductor substrate 110 except the capacitor region 200. The first refractory metal layer 105 is then exposed to an etchant to substantially remove the first refractory metal layer 105 from the capacitor region 200.

The mask 205 is preferably made of a resist material such as photoresist, and is patterned to cover all regions of the semiconductor substrate 110 except the capacitor region 200 using conventional lithographic procedures. Any conventional procedure can be used to remove the first refractory metal layer 105, including wet and dry etch procedures. For instance, when the first refractory metal layer 105 is titanium, a preferred wet etchant is an aqueous solution of hydrogen peroxide and ammonium. In other instances however, a dry etch is preferred because a wide variety of commercially available metal dry etch tools can be used.

Figure 3:
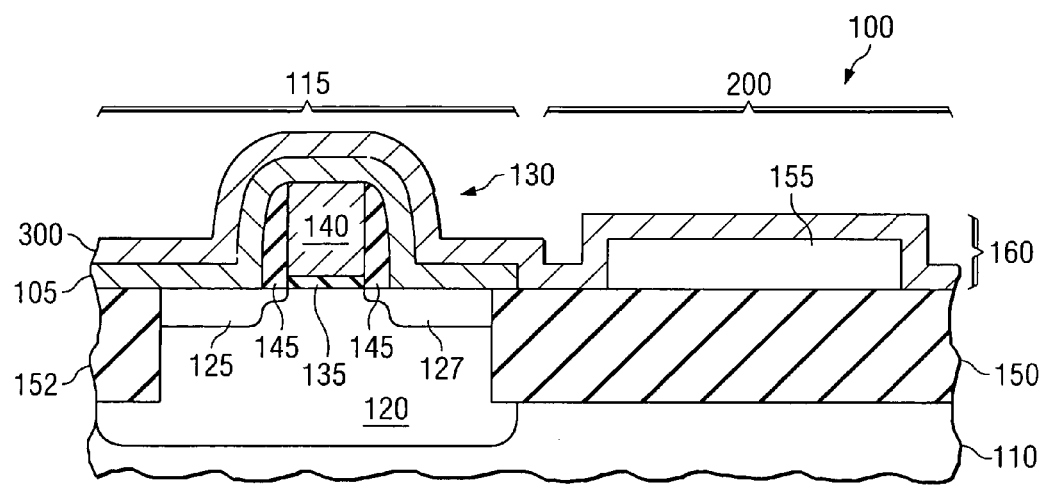

While maintaining reference to FIGS. 1-2, illustrated in FIG. 3 is the partially completed MIM capacitor 100 after removing the mask 205 depicted in FIG. 2, and depositing a second refractory metal layer 300 over the capacitor region 200. Preferably the second refractory metal layer 300 is formed on the silicon layer 155. Similar to the first refractory metal 105 deposition, the second refractory metal layer 300 is preferably blanket deposited and therefore is deposited over the entire surface of the semiconductor substrate 110. The second refractory metal layer 300 can be deposited using any conventional processes including the same PVD and CVD processes that can be used to deposit the first refractory metal 105. It can be advantageous for the second refractory metal layer 300 to be made of the same material as the first refractory metal layer 105. For instances, the first and second refractory metal layers 105, 300 are both composed of titanium in some preferred embodiments. Using the same refractory metal for the first and second refractory metal layers 105, 300 advantageously avoids substantially different degrees of silicidation of these layers 105, 300.

The second refractory metal layer 300 comprises the first conductive plate 160 in the MIM capacitor 100. To provide a low leakage current MIM capacitor 100 it is preferable for the thickness of the second refractory metal layer 300 to be less than the thickness of the first refractory metal layer 105. In some preferred embodiments, a thickness of the second refractory metal layer 300 is at least about 30 percent less than a thickness of the first refractory metal layer 105. In other preferred embodiments, the second refractory metal layer 105 and has a thickness of between about 10 nanometers and about 50 nanometers.

Figure 4:
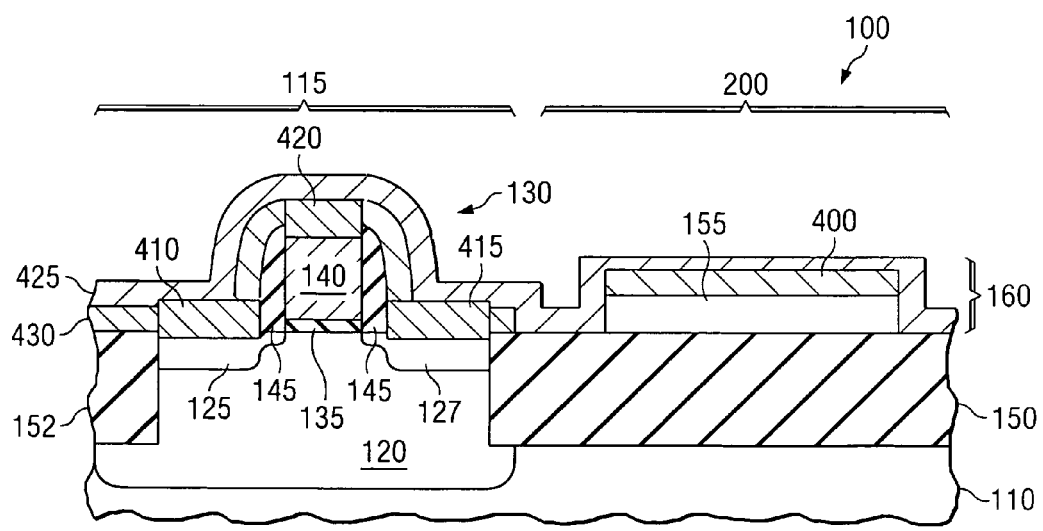

Turning now to FIG. 4, with continuing reference to FIGS. 1-3, illustrated is the MIM capacitor 100 after reacting the second refractory metal layer 300 with at least a portion of the silicon layer 155 to form a silicided refractory metal layer 400. In some instances the silicided refractory metal layer 400 has a thickness that is between about 1 and about 2 times the thickness of the second refractory metal layer 300 shown in FIG. 3.

In preferred embodiments, the reaction to form the silicided refractory metal layer 400 includes heating the second refractory metal layer 300 and the silicon layer 155. For instance, when the second refractory metal 300 is made of titanium, it is preferable to heat to a temperature of between about 600° C. and about 900° C. for at least about 1 second. More preferably, heating comprises a first stage of heating to a temperature of about 680° C. for 1 second to form a metal silicide, followed by a second stage of annealing at a temperature of about 820° C. for about 1 second to complete the formation of the silicided refractory metal layer 400. One of ordinary skill in the art would understand how to adjust the temperature and duration of heating to achieve silicidation of different refractory metals.

As further illustrated in FIG. 4, during the above-described reaction, the first refractory metal 105 over the transistor 115 is also silicided to form metal-silicided source drain electrodes 410, 415, and a metal-silicided gate electrode 420. As also illustrated in FIG. 4, unreacted portions of the second refractory metal layer 425 can remain after the above-described reaction to form the silicided refractory metal layer 400. For the purposes of the present invention, an unreacted portion of the refractory metal layer 425 is defined as that portion of the second refractory metal layer whose silicon content is less than about 1 atom percent. Similarly, unreacted portions of the first refractory metal layer 430 can also remain over the semiconductor substrate 110. In addition, the silicon layer 155 in the capacitor region 200 may not be fully consumed by the reaction to form the silicided refractory metal layer 400. In such instances, both the silicided refractory metal layer 400 and the silicon layer 155 comprise the first conductive plate 160 of the MIM capacitor 100.

Figure 5:
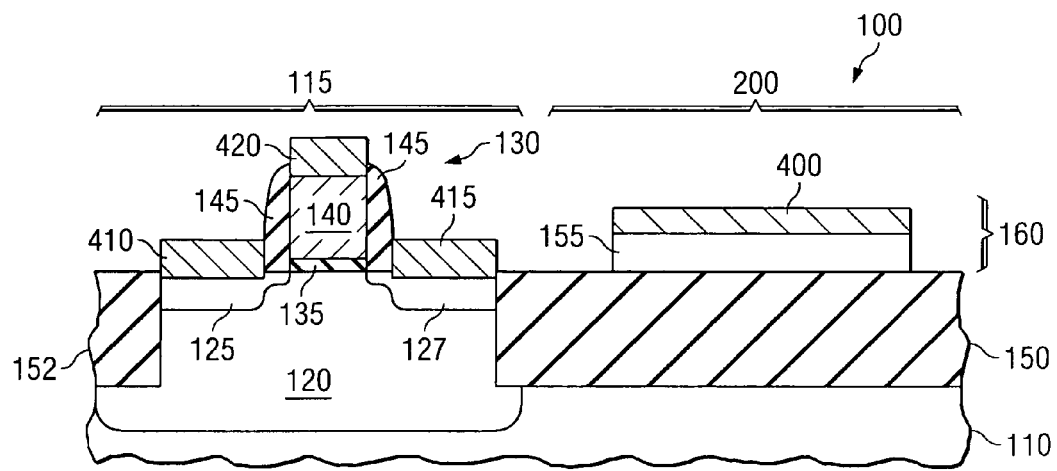

Turning now to FIG. 5, with continuing reference to FIGS. 1-4, illustrated is the MIM capacitor 100 after removing the unreacted portions of the second refractory metal layer 425 from the capacitor region 200. As depicted FIG. 5, removal is preferably a blanket removal process, and therefore unreacted portions of the second refractory metal layer 425, shown in FIG. 4, are also removed from over the entire semiconductor substrate 110. The removal process can also advantageously remove unreacted portions of the first refractory metal layer 430 shown in FIG. 4.

The removal process is configured to selectively remove the unreacted refractory metal layers 425, 430 and retain the silicided refractory metal layers 400, 410, 415, 420. For instance, when the unreacted portion of the second refractory metal layer 425 is made of titanium, an advantageous removal process can comprises a wet etch process using an aqueous solution of hydrogen peroxide and ammonium hydroxide. An example of a preferred wet etchant is H2O:H2O2:NH4OH in a ratio of about 5:1:1 to about 6:1:1. of course, any number of conventional wet etch or dry etch processes well known to those skilled in the art can be used to remove non-silicided refractory metals for the semiconductor substrate 110.

Figure 6:
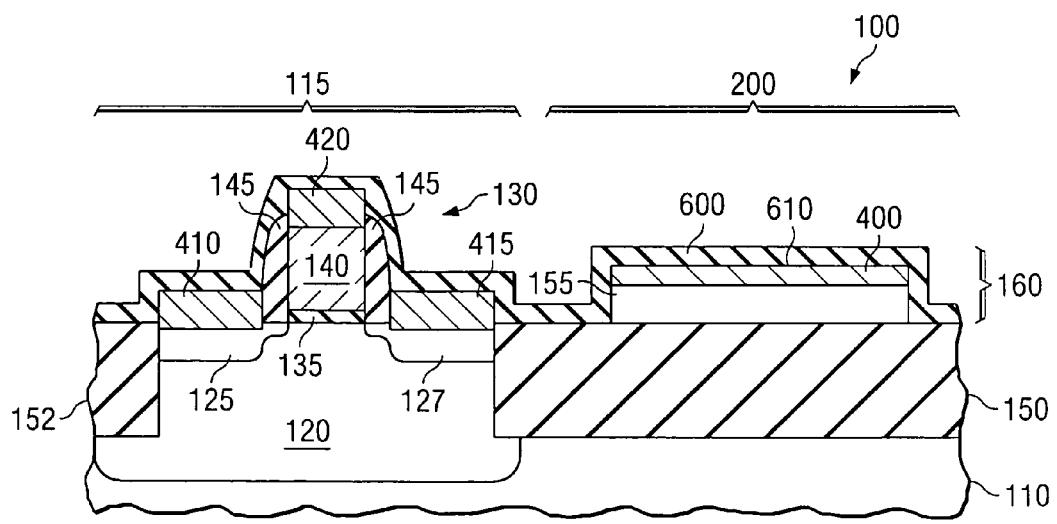

While maintaining reference to FIG. 1-5, FIG. 6 shows the partially completed MIM capacitor 100 after forming a dielectric layer 600 on the silicided refractory metal layer 400. As illustrated in FIG. 6, it can be advantageous for the dielectric layer 600 to be formed over the entire semiconductor substrate 100 using a blanket deposition process. Preferably the dielectric layer 600 is composed of a high-dielectric material. For the purposes of the present invention, a high-k dielectric material has a dielectric constant of greater than about 4, and more preferably, between about 6 and about 20.

Any conventional procedure well known to those skilled in the art can be used to form the dielectric layer 600. For instance, in some cases, the dielectric layer is a mixture of silicon oxide and silicon nitride applied via a low pressure chemical vapor deposition (LPCVD) process using dichlorosilane and nitrous oxide as the source gases. In other embodiments, source gases, such as silane and TEOS, can be used to form a silicon dioxide layer via LPCVD.

Advantageous methods of manufacturing the MIM capacitor 100 according to the principles of the present invention provide a smooth interface 610 between the silicided refractory metal layer 400 and the dielectric layer 600. For instance, in certain preferred embodiments, the interface 610 has a roughness of less than about ±15 nanometers, and more preferably less than about ±12 nanometers. The term roughness as used herein refers to the root mean square variation in the thickness of the silicided refractory metal layer 400 at the interface 610. As discussed above, the creation of a smooth interface is facilitated by reacting a thin second refractory metal layer 300 with the silicon layer 155.

Figure 7:
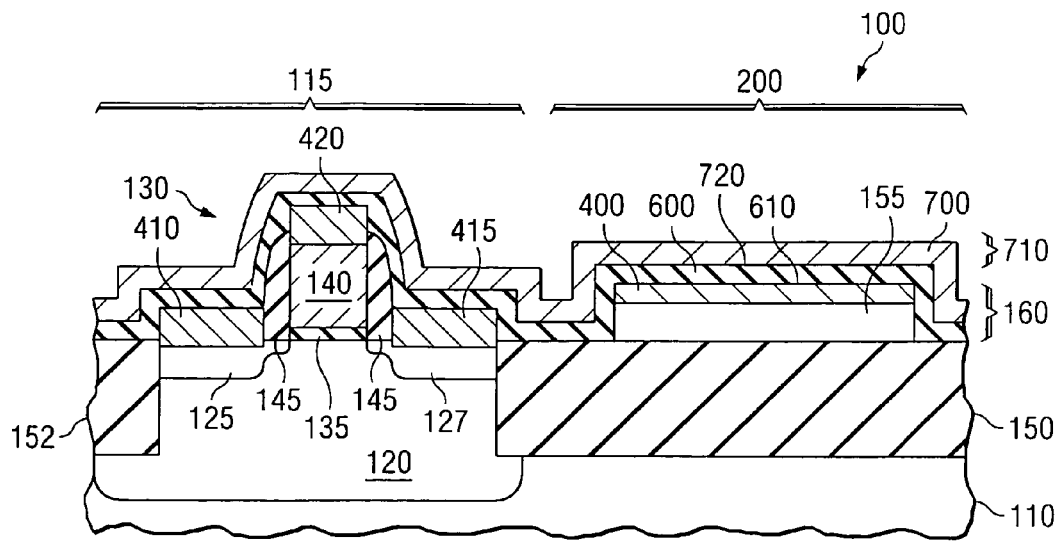

Turning now to FIG. 7, and with continued reference to FIGS. 1-7, shown is the partially completed MIM capacitor 100 after depositing a metal layer 700 on the dielectric layer 600. As illustrated in FIG. 7, in some embodiments it is advantageous to blanket deposit the metal layer 700 over the semiconductor substrate 110. Any conventional processes can be used to deposit the metal layer 700, including the same PVD or CVD processes used to form the first and second refractory metal layers 105, 300. The metal layer 700 comprises a second conductive plate 710 in the MIM capacitor 100. In preferred embodiments, the metal layer 700 is a titanium-tungsten (TiW) layer deposited by sputtering. However the metal layer 700 can comprise any refractory metal, or other metals such as gold or aluminum, either alone or in combination, deposited as alloyed layers or separate layers.

In some advantageous embodiments, a second interface 720, located between the dielectric layer 600 and the metal layer 700, has a roughness that is substantially the same as roughness of the interface 610 between the silicided refractory metal layer 400 and the dielectric layer 600. The production of the second interface 720 having a low roughness is facilitated by the judicious selection of the processes for forming the dielectric layer 600 and metal layer 700. Advantageous processes conformally replicate the roughness of the interface 610 between the silicided refractory metal layer 400 and the dielectric layer 600. For example, in some preferred embodiments, the dielectric layer 600 is formed by a LPCVD process and the metal layer 700 is deposited by sputtering. By using such procedures, the roughness of the second interface 720 can be advantageously limited to being between about 1 and about 2 times the roughness of the interface 610 between the silicided refractory metal layer 400 and the dielectric layer 600.

Figure 8:
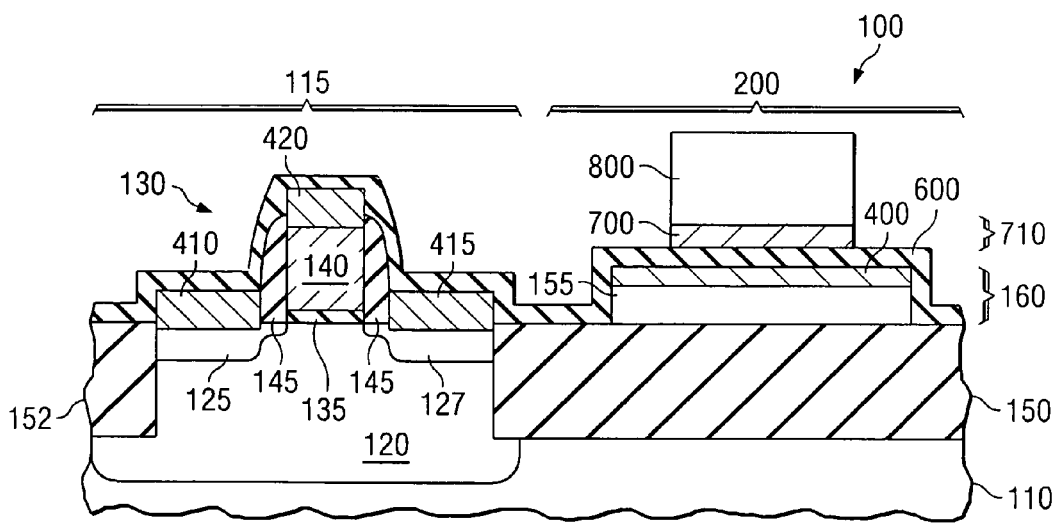

As illustrated in FIG. 8, with continuing reference to FIG. 1-7, the manufacture of the second conductive plate 710 can include forming a second mask 800 over the metal layer 700 in the capacitor region 200, and removing portions of the metal layer 710 that are not covered by the second mask 800. Substantially the same resist materials and patterning procedures can be used to form the second mask 800 as used to form the first mask 200 shown in FIG. 2. As illustrated in FIG. 8, the blanket-deposited metal layer 700 from FIG. 7 is removed from the capacitor region 200 and the other regions over the semiconductor substrate 110, such as the transistor 115. Removing can be accomplished by conventional dry or wet etch procedures, such as dry etching using a reactive ion etching tool. In some preferred embodiments, for example, source materials of BCl3 and SF6, are used to generate Cl- and F-ions to facilitate dry etching of the metal layer 700 down to the dielectric layer 600. Of after etching the second mask 800 can be removed using conventional procedures.

Figure 9:
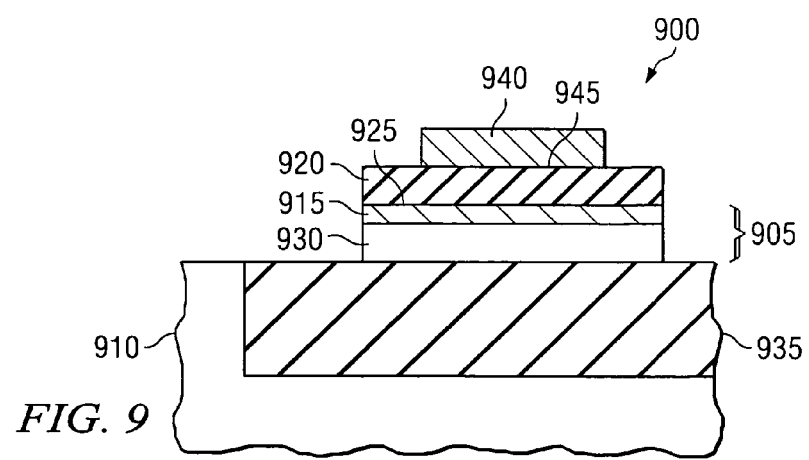
FIG. 9 illustrates an exemplary MIM capacitor of the present invention.

FIG. 9 presents an exemplary embodiment of yet another aspect of the present invention, a MIM capacitor 900. Any of the above-described processes and materials can be used to fabricate the MIM capacitor 900. Conversely, any of the embodiments of the MIM capacitor 900 described below can be made according to the above-described method of manufacture presented above and depicted in FIGS. 1-8.

As depicted in FIG. 9, the MIM capacitor 900 includes a first conductive plate 905 located over a semiconductor substrate 910. The first conductive plate 905 includes a silicided refractory metal layer 915. The MIM capacitor 900 further comprises a dielectric layer 920 over and preferably on the first conductive plate 905. An interface 925 between the first conductive plate 905 and the dielectric layer 920 has a roughness of between about ±5 nanometers and about ±15 nanometers, and more preferably between about ±5 nanometers and about ±10 nanometers.

Although any refractory metal is within the scope of the present invention, preferred embodiments of the silicided refractory metal layer 915 can comprise titanium, Other suitable refractory metals are nickel, cobalt, and mixtures thereof. In some preferred embodiments of the MIM capacitor 900, the silicided refractory metal layer 915 is titanium silicide. Preferred thicknesses of the refractory metal layer 915 are between about 20 and about 100 nanometers, and more preferably between about 20 and about 40 nanometers. These thickness are preferred because they facilitate the production of an interface 925 having a low roughness, as discussed above.

Another beneficial feature of the present invention in that the size of the capacitor 100 can be reduced, by using a thinner dielectric layer 920 than previous possible. The dielectric layer 920 preferably has a thickness of between about 10 and about 100 nanometers and more preferably between about 10 and about 70 nanometers. As one of ordinary skill in the art would understand, capacitor leakage is inversely proportional to the thickness of the dielectric layer 920. The presence of a smoother interface 620 helps to reduce the high leakage current and low breakdown voltage, thereby allowing one to reduce the thickness of the dielectric layer 920. Preferred embodiments of the dielectric layer 920 comprise a high k dielectric material such as silicon dioxide, silicon nitride, or silicon oxynitride. Other advantageous high k dielectric materials are aluminum oxide, tantalum oxide, zirconium oxide, titanium oxide and mixtures thereof.

As further illustrated in FIG. 9, the first conductive plate 910 can further include a polysilicon layer 930 located between the semiconductor substrate 910 and the silicided refractory metal layer 915. The polysilicon layer 930 advantageously provides a source of silicon atoms for forming the silicided refractory metal layer 915. Preferably, the polysilicon layer 930 is located on an insulating layer 935, which electrically isolates the MIM capacitor 900 from other device structures. In certain embodiments the polysilicon layer 930 is formed from a blanket-deposited polysilicon layer which is also used as the gate in transistors (see e.g., FIG. 1). In such embodiments, the polysilicon layer 930 has a thickness of between about 400 nanometers and 600 nanometers, and more preferably about 450 nanometers. However, in other embodiments where, the polysilicon layer 930 was not formed from a blanket-deposited polysilicon layer configured for such dual purposes, its thickness can be between about 50 nanometers and about 400 nanometers, and more preferably between about 50 nanometers and 100 nanometers.

As also illustrated in FIG. 9, the MIM capacitor 900 can include a second conductive plate 940 located on the dielectric layer 920. In some preferred embodiments, the second conductive plate 940 comprises the same refractory metal as in the silicided refractory metal layer 915. In can be advantageous to use to the same refractory metal to simplify manufacturing process. In some preferred embodiments, the second conductive plate 940 is made of a titanium tungsten alloy. In other embodiments, however, the second conductive plate 940 is made of another refractory metal or other metal such as gold or aluminum. In some advantage embodiments, the second conductive plate 940 has a thickness of between about 300 nanometers and 400 nanometers, and more preferably about 350 nanometers. Such thickness are preferred because they are sufficiently large to prevent punch-through during contact etching. However, other thickness, for example, between about 50 nanometers and 300 nanometers, are also within the scope of the present invention.

The particular embodiment of the MIM capacitor 900 shown in FIG. 9 is configured to operate by applying a positive voltage to the second conductive plate 940. In such configurations, because electrons are injected from the first conductive plate 905 into the dielectric layer 920, the leakage current is predominantly reduced by providing the interface 925 with a low roughness. Additionally, in some embodiments, the leakage current of the MIM capacitor 900, can be further reduced when a second interface 945 between the dielectric layer 920 and the second conductive plate 940 has a roughness between about 1 and about 2 times of the roughness of the interface 925 between the first conductive plate 905 and the dielectric layer 920.

Of course, other configurations of the MIM capacitor 900 are within the scope of the present invention. For instance, configurations where a positive voltage is applied to the first conductive plate 940, are also included within the scope of the present invention. One of ordinary skill in the art would understand how to follow the principles of the present invention to make suitable adjustments in the structure of the MIM capacitor to minimize the leakage current for such configurations.

Still another aspect of the present invention is a method of manufacturing an integrated circuit. FIGS. 10-14 illustrate cross-sectional views of selected steps in an exemplary method of manufacturing an integrated circuit 1000 according to the principles of the present invention. Any of the processes and materials discussed above and illustrated in FIGS. 1-9 can be used to fabricate components of the integrated circuit 1000.

Turning first to FIG. 10, illustrated is the partially constructed integrated circuit 1000 after forming transistors 1010, 1012 over a semiconductor substrate 1015 in a transistor region 1020. As further illustrated in FIG. 10, advantageous embodiments include an insulating layer 1025 in the substrate 1015 with a patterned polysilicon layer 1030 thereon. The polysilicon layer 1030 is preferably formed in one or more capacitor regions 1035 of the integrated circuit 1000.

Any conventional process can be used to manufacture the transistors 1010 1012. In some preferred embodiments, the transistors 1010, 1012 are nMOS and pMOS transistors, and are configured to form an active device 1040 that is a CMOS device. Of course other types of transistors, including Junction Field Effect transistors, bipolar transistors, biCMOS transistors, as well as diodes, and other semiconductor components, or combinations thereof are within the scope of the present invention.

FIG. 10 also illustrates the partially completed integrated circuit 1000 after forming a first refractory metal layer 1045 over the transistor region 1020 and a capacitor region 1035. In some preferred embodiments, portions of the blanket-deposited first refractory metal layer 1045 are used to form metal silicided electrodes for the transistors 1010.

With continuing reference to FIG. 10, FIGS. 11-13 illustrate the partially completed integrated circuit 1000 at selected stages in the formation of at least one MIM capacitor 1100 over the semiconductor substrate 1015 in the capacitor region 1035. Referring now to FIG. 11, depicted is the integrated circuit 1000 after removing the first refractory metal layer 1030 in the capacitor region 1035. Removing can be facilitated by forming a mask 1110 over the semiconductor substrate 1015, except in the capacitor region 1035, and then exposing the capacitor region 1035 to an etchant.

FIG. 12 depicts the integrated circuit 1000 after removing the mask 1110 shown in FIG. 11 and depositing a second refractory metal layer 1200 over the capacitor region 1035. As illustrated, in some advantageous embodiments, the second refractory metal layer 1200 is blanket-deposited over the entire substrate 1015, including the transistor region 1020. In certain preferred embodiments a thickness of the second refractory layer 1200 is less than a thickness of the first refractory metal layer 1045.

With continuing reference to FIGS. 10-12, FIG. 13 presents the partially constructed integrated circuit 1000 after reacting the second refractory metal layer 1200 with at least a portion of the polysilicon layer 1030 to form a silicided refractory metal layer 1300. As further illustrated, during this reaction, portions of the first refractory metal are also silicided to form electrodes 1310 on the transistors 1010, 1012. Unreacted portions of the first or second refractory metal layers 1045, 1200 are preferably removed after the silicidation reaction. As further illustrated in FIG. 13 the construction of the MIM capacitor 1100 can be completed by forming a dielectric layer 1320 on the silicided refractory metal layer 1300, and a second capacitor plate 1330 on the dielectric layer 1320.

Figure 14:
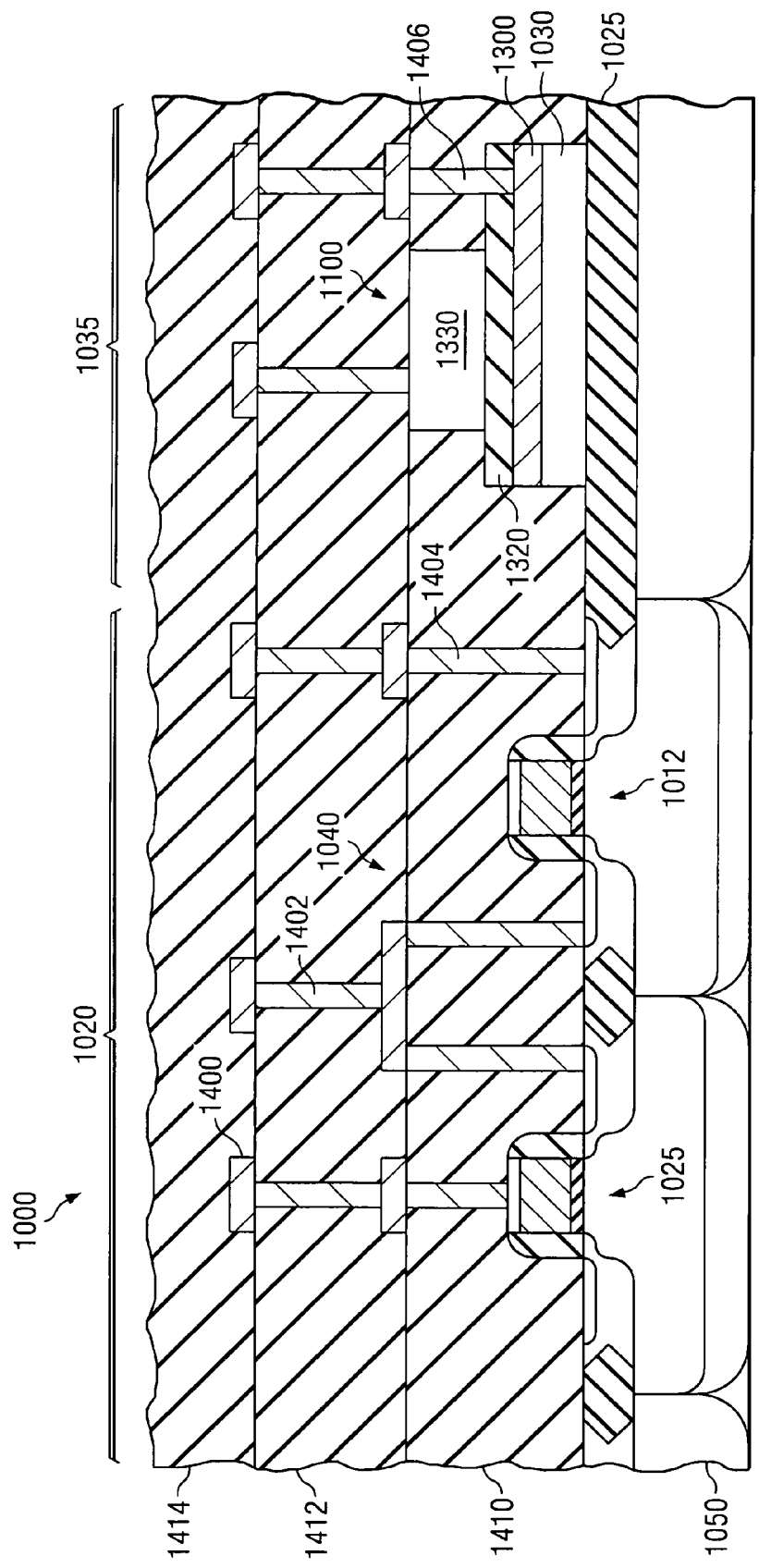

Turning now to FIG. 14, while maintaining reference to FIGS. 10-13, illustrated is the integrated circuit 1000 after forming interconnections 1400, 1402, 1404, 1406 on one or more insulating layers 1410, 1412, 1414 located over the transistors 1010, 1012 and the MIM capacitor 1100 to thereby interconnect the MIM capacitor 1100 and the transistors 1010, 1012 to form an operative active device 1040.

Preferred embodiments of the active device 1040 include memory devices and analog devices. Preferred memory devices include random access memory devices, and even more preferably static random access memory (SRAM). However other memory devices, where a low capacitor leakage current is desirable, are within the scope of the present invention. Preferred analog devices include analog-to-digital or digital-to-analog devices, and filters, such as low pass filters.

Although the present invention has been described in detail, those skilled in the art should understand that they can make various changes, substitutions and alterations herein without departing from the scope of the invention in its broadest form.

What is claimed is:

1. A metal insulator metal (MIM) capacitor, comprising:
   a first conductive plate located over a semiconductor substrate and comprising a silicided refractory metal layer, wherein the refractory metal layer comprises an element selected from the group consisting of elements from Groups 4-6 and Periods 4-6, and Lanthanide and Actinide series elements; and
   a dielectric layer on said first conductive plate, wherein an interface between said first conductive plate and said dielectric layer has a roughness of between about ±5 nanometers and about ±15 nanometers.

2. The capacitor as recited in claim 1, wherein said first conductive plate further includes a polysilicon layer located between said semiconductor substrate and said silicided refractory metal layer.

3. The capacitor as recited in claim 1, wherein said silicided refractory metal layer includes a refractory metal selected from the group consisting of:
   titanium;
   nickel;
   cobalt; and
   mixtures thereof.

4. The capacitor as recited in claim 1, further including a second conductive plate located on said dielectric layer.

5. The capacitor as recited in claim 4, wherein said second conductive plate comprises said refractory metal.

6. The capacitor as recited in claim 4, wherein said second conductive plate is a titanium tungsten alloy.

7. The capacitor as recited in claim 4, wherein a second interface between said dielectric layer and said second conductive plate has a second roughness that is between about 1 and about 2 times said roughness.

8. The capacitor as recited in claim 1, wherein said dielectric layer has a thickness of between about 10 and about 100 nanometers and comprises a high k dielectric material.

9. The capacitor as recited in claim 8, wherein said high k dielectric material is selected from the group consisting of:
   silicon dioxide;
   silicon nitride;
   aluminum oxide;
   tantalum oxide;
   zirconium oxide;
   titanium oxide; and
   mixtures thereof.

* * * * *